United States Patent
Lin et al.

(10) Patent No.: US 11,581,403 B2
(45) Date of Patent: Feb. 14, 2023

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Tien-Lu Lin, Hsinchu (TW); Jung-Hung Chang, Changhua County (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 119 days.

(21) Appl. No.: 17/091,595

(22) Filed: Nov. 6, 2020

(65) Prior Publication Data

US 2021/0057522 A1 Feb. 25, 2021

Related U.S. Application Data (62) Division of application No. 15/677,089, filed on Aug. 15, 2017, now Pat. No. 10,833,152.

(51) Int. Cl.
| | |
|---|---|
| *H01L 29/06* | (2006.01) |
| *H01L 21/8238* | (2006.01) |
| *H01L 27/092* | (2006.01) |
| *H01L 27/12* | (2006.01) |
| *H01L 21/84* | (2006.01) |
| *H01L 29/10* | (2006.01) |

(52) U.S. Cl.
CPC .. *H01L 29/0649* (2013.01); *H01L 21/823821* (2013.01); *H01L 21/823878* (2013.01); *H01L 21/823892* (2013.01); *H01L 27/0921* (2013.01); *H01L 27/0924* (2013.01); *H01L 21/823807* (2013.01); *H01L 21/845* (2013.01); *H01L 27/1211* (2013.01); *H01L 29/1054* (2013.01)

(58) Field of Classification Search
CPC ................................................ H01L 21/823878
See application file for complete search history.

(56) References Cited

U.S. PATENT DOCUMENTS

| | | |
|---|---|---|
| 6,872,610 B1 | 3/2005 | Mansoori et al. |
| 8,796,666 B1 | 8/2014 | Huang et al. |
| 8,815,712 B2 | 8/2014 | Wan |
| 8,963,258 B2 | 2/2015 | Yu et al. |
| 9,093,530 B2 | 7/2015 | Huang et al. |
| 9,171,929 B2 | 10/2015 | Lee et al. |
| 9,214,555 B2 | 12/2015 | Oxland et al. |

(Continued)

*Primary Examiner* — John A Bodnar
(74) *Attorney, Agent, or Firm* — Birch, Stewart, Kolasch & Birch, LLP (57) ABSTRACT

A method includes forming a pad layer and a mask layer over a substrate; patterning the mask layer, the pad layer, and the substrate to form pads, masks, and first and semiconductor fins over the substrate; forming a liner covering the pads, the masks, and the first and second semiconductor fins; removing a first portion of the liner to expose sidewalls of the first semiconductor fin, while leaving a second portion of the liner covering sidewalls of the second semiconductor fin; forming an isolation material over the substrate; and performing a CMP process to the isolation material until a first one of the pads over the second semiconductor fin is exposed; and etching back the isolation material and the second portion of the liner.

20 Claims, 5 Drawing Sheets

(56) References Cited

U.S. PATENT DOCUMENTS

| | | |
|---|---|---|
| 9,236,267 B2 | 1/2016 | De et al. |
| 9,520,482 B1 | 12/2016 | Chang et al. |
| 9,548,303 B2 | 1/2017 | Lee et al. |
| 9,576,814 B2 | 2/2017 | Wu et al. |
| 2014/0159171 A1 | 6/2014 | Cai et al. |
| 2016/0056156 A1* | 2/2016 | Ghani ............... H01L 29/66803 438/283 |
| 2016/0133746 A1* | 5/2016 | Su .................. H01L 21/823821 438/283 |
| 2016/0247876 A1 | 8/2016 | Chung et al. |
| 2016/0284706 A1* | 9/2016 | Chung ............... H01L 27/0207 |
| 2017/0053835 A1 | 2/2017 | Sung et al. |

\* cited by examiner

SEMICONDUCTOR DEVICE AND MANUFACTURING METHOD THEREOF

PRIORITY CLAIM AND CROSS-REFERENCE

The present application is a Divisional application of U.S. application Ser. No. 15/677,089, filed on Aug. 15, 2017, now U.S. Pat. No. 10,833,152, issued on Nov. 10, 2020, which is herein incorporated by reference in its entirety.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (FinFET). FinFET devices are a type of multi-gate structure that include semiconductor fins with high aspect ratios and in which channel and source/drain regions of semiconductor transistor devices are formed. A gate is formed over and along the sides of the fin structure (e.g., wrapping) utilizing the increased surface area of the channel and source/drain regions to produce fast, reliable and well-controlled semiconductor transistor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A to 9 illustrate a method of manufacturing a semiconductor device at various stages in accordance with some embodiments.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

While non-planar devices, such as multi gate devices or FINFET devices, have been offered for future technologies to mitigate problems with scaling planar CMOS technologies, such multiple gate designs create challenges in designing and forming other devices such as bipolar devices. Unlike planar technologies, where gate lengths and gate pitch can be substantially varied, the designs for non-planar devices offer little flexibility. For example, the fin height, width, and pitch are constant for a given technology due to the complexity of forming such a structure. Hence, the design space for FinFET devices is less flexible than the corresponding design space for planar devices.

The reduced flexibility of non-planar device designs creates challenges in designing other devices such as a non-planar MOS device. One of the challenges involves the formation of contacts to the MOS device. For example, it is a challenge to contact the base region of the MOS device. Moreover, in an n-type region, charges (e.g. electrons) may accumulate at an interface between liner and the semiconductor fin, which may also be referred to as "charge effect." The accumulated charges may induce lower barrier, and produce a leakage path from the contact (e.g., an n-type epitaxy structure) and the base region (e.g., an n-type well), which is also be referred to as "latch-up effect." As such, the following paragraphs provide embodiments of semiconductor devices and manufacturing method thereof to improve the latch-up problem.

FIGS. 1A to 9 illustrate a method of manufacturing a semiconductor device at various stages in accordance with some embodiments.

Figure 1A:
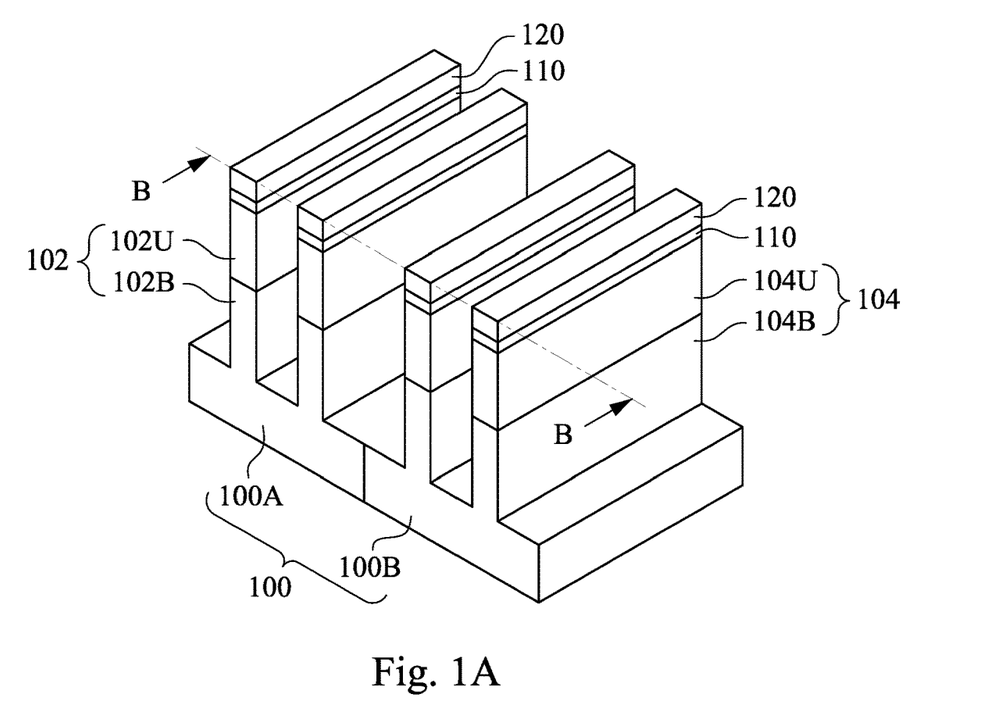
Figure 1B:
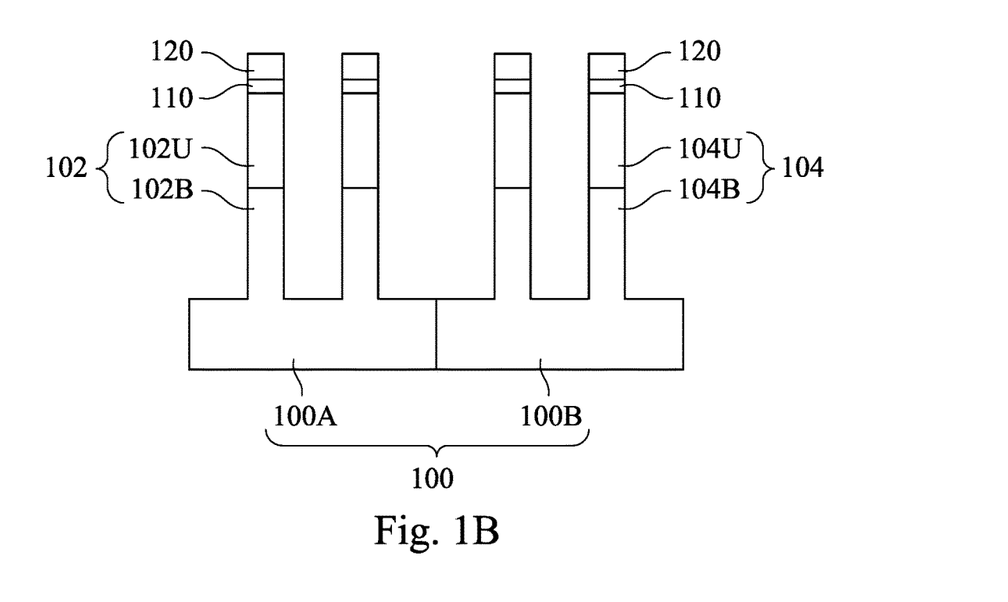

Reference is made to FIGS. 1A and 1B. FIG. 1B is a cross-sectional view along line B-B of FIG. 1A. A substrate 100 is provided. The substrate 100 includes a first region 100A and a second region 100B. The first region 100A and the second region 100B may have different dopant types. For example, the first region 100A may be an n-type region, and the second region 100B may be a p-type region. The first region 100A and a second region 100B may also be referred to as a first well 100A and a second well 100B, respectively, in which the first well 100A and the second well 100B have different dopant types. The first region 100A and the second region 100B may be forming by doping the first region 100A of the substrate 100 with first dopants, and doping the first region 100A of the substrate 100 with second dopants different from the first dopants, respectively.

The first dopants may be n-type dopants, such as phosphorus or arsenic, or combinations thereof. The second dopants may be p-type dopants, such as boron or $BF_2$, or combination thereof. The first region 100A and the second region 100B may be formed on the substrate 100, in a P-well structure, in an N-well structure, in a dual-well structure, and/or using a raised structure.

The substrate 100 may be a bulk silicon substrate. Alternatively, the substrate 100 may include an elementary semiconductor, such as silicon (Si) or germanium (Ge) in a crystalline structure; a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb); or combinations thereof. Possible substrates 100 also include a silicon-on-insulator (SOI) substrate. SOI substrates are fabricated using separation by implantation of oxygen (SIMOX), wafer bonding, and/or other suitable methods.

The substrate 100 further includes a plurality of first semiconductor fins 102 and second semiconductor fins 104, in which the first semiconductor fins 102 are disposed over the first region 100A of the substrate 100, and the second semiconductor fins 104 are disposed over the second region 100B of the substrate 100, respectively. The first semiconductor fins 102 and the second semiconductor fins 104 may have different dopant types. For example, in some embodiments, the first semiconductor fins 102 is n-type, and the second semiconductor fins 104 is p-type. It is noted that the numbers of the first semiconductor fins 102 and the second semiconductor fins 104 in FIG. 1A is illustrative, and should not limit the present disclosure. A person having ordinary skill in the art may select suitable numbers for the first semiconductor fins 102 and the second semiconductor fins 104 according to actual situations.

In some embodiments, the first semiconductor fins 102 and the second semiconductor fins 104 may include different portions. For example, one of the first semiconductor fins 102 has an upper portion 102U and a bottom portion 102B. In some embodiments, the upper portion 102U and the bottom portion 102B may be formed by silicon (Si) but include different lattice constant and/or dopant concentrations. Similarly, one of the second semiconductor fins 104 has an upper portion 104U and a bottom portion 104B. In some embodiments, the upper portions 104U may be formed by silicon germanium (SiGe), and the bottom portion 102B may be formed by Si, respectively. In some other embodiments, the first semiconductor fins 102 and second semiconductor fins 104 are formed in one-piece. That is, the first semiconductor fins 102 and second semiconductor fins 104 are made of the same material and do not include different portions.

A plurality of pads 110 are disposed respectively over the first semiconductor fins 102 and the second semiconductor fins 104, and a plurality of hard masks 120 are formed over the pads 110 and disposed respectively over the first semiconductor fins 102 and the second semiconductor fins 104. In some embodiments, the pads 110 may be a thin film including silicon oxide formed by, for example, using a thermal oxidation process. The pads 110 may act as an adhesion layer between the semiconductor fins 102, 104 and the hard masks 120. In some embodiments, the hard masks 120 is formed of silicon nitride (SiN), for example, using low-pressure chemical vapor deposition (LPCVD) or plasma enhanced chemical vapor deposition (PECVD). The hard masks 120 are used as masks that pattern the first semiconductor fins 102 and the second semiconductor fins 104 and are used as protective layers during following processes, such as photolithography.

In greater detail, the first semiconductor fins 102 and the second semiconductor fins 104 may be formed by suitable method. For example, a pad layer and a mask layer may be blanketed over the substrate 100. A patterned photo-sensitive layer is formed over the pad layer, the mask layer, and the substrate 100. Then, the pad layer, the mask layer, and the substrate 100 may be patterned using one or more photolithography processes with the patterned photo-sensitive layer, including double-patterning or multi-patterning processes, to form the pads 110, the hard masks 120, the first semiconductor fins 102, and the second semiconductor fins 104.

Figure 2:
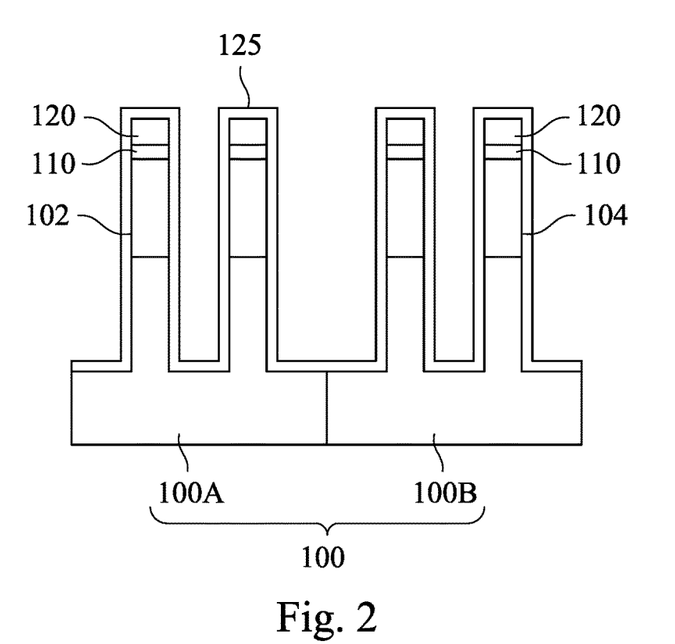

Reference is made to FIG. 2. A liner 125 is formed over the substrate 100 and covering the first semiconductor fins 102 and the second semiconductor fins 104. The liner 125 is in contact with and conformal to the first semiconductor fins 102 and the second semiconductor fins 104. In some embodiments, the liner 125 is made from SiN or other suitable materials. The liner 125 may be formed by, for example, atomic layer deposition (ALD), or other suitable processes.

Figure 3:
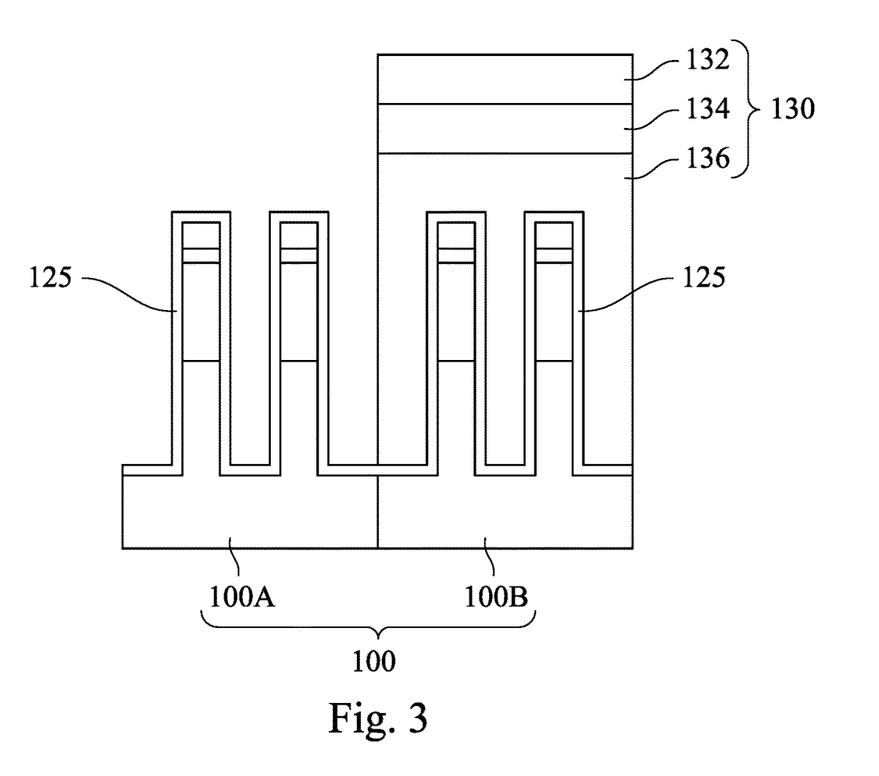

Reference is made to FIG. 3. A patterned tri-layer photoresist 130 may be used, including a photoresist (PR) layer 132 as the top or uppermost portion, a middle layer 134, and a bottom layer 136. The patterned tri-layer photoresist 130 covers the second region 100B of the substrate 100. The patterned tri-layer photoresist 130 provides the PR layer 132, the middle layer 134 which may include anti-reflective layers or backside anti-reflective layers to aid in the exposure and focus of the PR processing, and the bottom layer 136 which may be a hard mask material; for example, a nitride.

The patterned tri-layer photoresist 130 may be formed by depositing the bottom layer, the middle layer, and the PR layer blanket over the substrate 100. Then, the PR layer is patterned to exposes portions of the middle layer disposed over the first region 100A of the substrate 100. Meanwhile, another portions of the middle layer 134 disposed over the second region 100B of the substrate 100 are still covered by the patterned PR layer 132. To pattern the tri-layer photoresist 130, the PR layer 132 is patterned using a mask, exposure to radiation, such as light or an excimer laser, for example, a bake or cure operation to harden the resist, and use of a developer to remove either the exposed or unexposed portions of the resist, depending on whether a positive resist or a negative resist is used, to form the pattern from the mask in the patterned PR layer 132. This patterned PR layer 132 is then used to etch the underlying middle layer and bottom layer. Then, using the patterned PR layer 132 as a mask, the middle layer and the bottom layer of the tri-layer photoresist are etched to form the patterned middle layer 134 and the patterned bottom layer 136, respectively. The etching process includes a dry etch, a wet etch, or a combination of dry etch and wet etch. Accordingly, portions of the liner 125 disposed over the first region 100A of the substrate 100 are exposed from the patterned tri-layer photoresist 130. In other words, the second region 100B of the substrate 100 is covered by the patterned tri-layer photoresist 130.

The dry etching process may implement fluorine-containing gas (e.g., $CF_4$, $SF_6$, $CH_2F_2$, $CHF_3$, and/or $C_2F_6$), chlorine-containing gas (e.g., $Cl_2$, $CHCl_3$, $CCl_4$, and/or $BCl_3$), bromine-containing gas (e.g., HBr and/or $CHBr_3$), oxygen-containing gas, iodine-containing gas, other suitable gases and/or plasmas, or combinations thereof. The etching process may include a multiple-step etching to gain etch selectivity, flexibility and desired etch profile.

Figure 4:
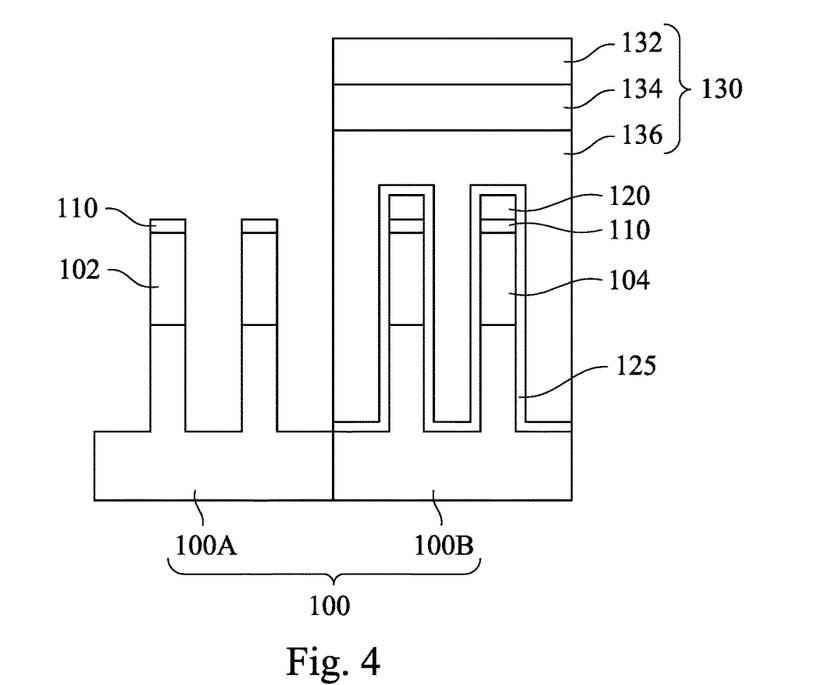

Reference is made to FIG. 4. An etching process is performed to remove a portion of the liner 125 exposed from the tri-layer photoresist 130. In some embodiments, since the liner 125 and the hard masks 120 may be formed from the same material, such as SiN, the hard masks 120 may also be removed during the etching process. As a result, the pads 110 and the first semiconductor fins 102 within the first region 100A of the substrate 100 are exposed.

The etching process includes dry etching process, wet etching process, and/or combination thereof. The removing process may also include a selective wet etch or a selective dry etch. A wet etching solution includes a tetramethylammonium hydroxide (TMAH), a HF/HNO$_3$/CH$_3$COOH solution, or other suitable solution. The dry and wet etching processes have etching parameters that can be tuned, such as etchants used, etching temperature, etching solution concentration, etching pressure, source power, RF bias voltage, RF bias power, etchant flow rate, and other suitable parameters. For example, a wet etching solution may include NH$_4$OH, KOH (potassium hydroxide), HF (hydrofluoric acid), TMAH (tetramethylammonium hydroxide), other suitable wet etching solutions, or combinations thereof. Dry etching processes include a biased plasma etching process that uses a chlorine-based chemistry. Other dry etchant gasses include CF$_4$, NF$_3$, SF$_6$, and He. Dry etching may also be performed anisotropically using such mechanisms as DRIE (deep reactive-ion etching).

Figure 5:
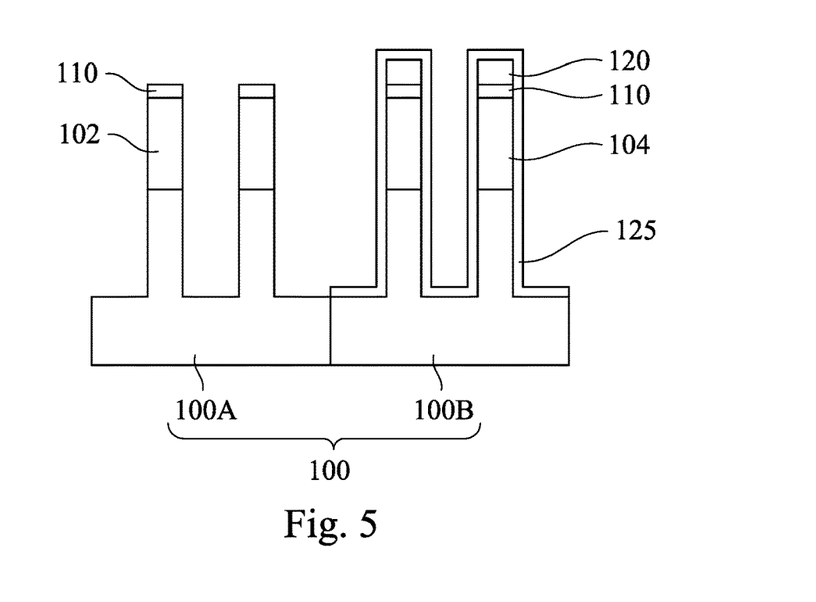

Reference is made to FIG. 5. After the portion of the liner 125 over the first region 100A of the substrate 100 is removed. The PR layer 132, the middle layer 134 and the bottom layer 136 of the tri-layer photoresist 130 (see FIG. 4) are removed, for example, by ashing. The ashing operation, such as a plasma ash, removes the remaining tri-layer photoresist 130, and a wet clean may be performed to clean the etch residues. After the tri-layer photoresist 130 is removed, the remained portion of the liner 125 disposed within the second region 100B of the substrate 100 is exposed.

Figure 6:
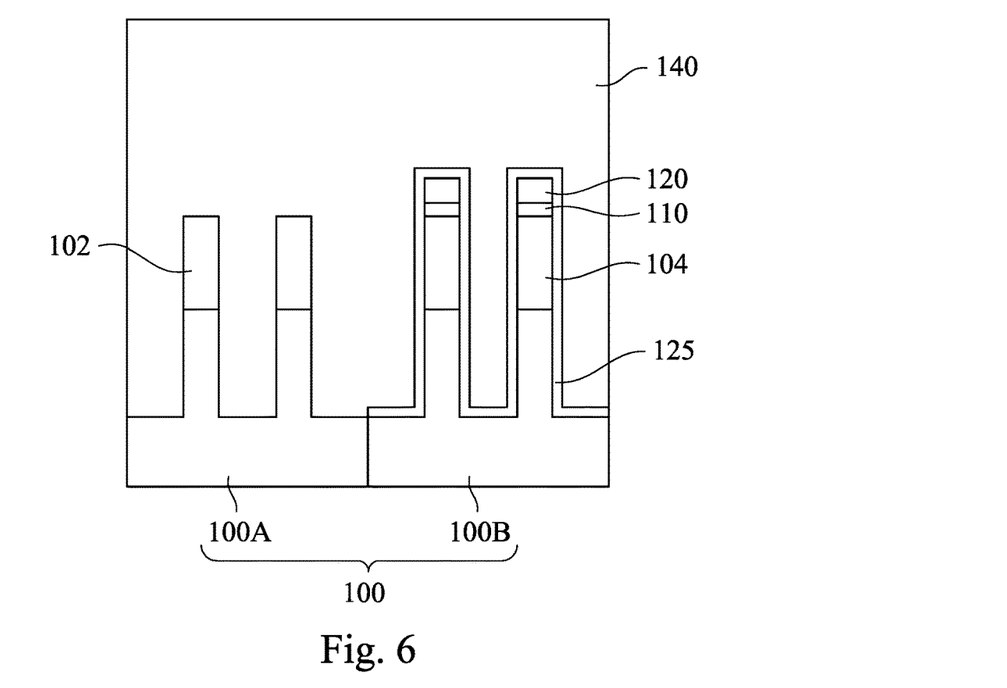

Reference is made to FIG. 6. An isolation layer 140 is formed over the substrate 100 to cover the first semiconductor fins 102 and the second semiconductor fins 104. The isolation layer 140 acts as a shallow trench isolation (STI) to separate the first semiconductor fins 102 within the first region 100A and second semiconductor fins 104 within the second region 100B. The isolation layer 140 may include oxide, such as silicon oxide, which may be formed using, for example, High-Density Plasma (HDP) chemical vapor deposition (CVD). The isolation layer 140 may also include an oxide formed by flowable chemical vapor deposition (FCVD), spin-on coating, or the like. In some embodiments, the isolation layer 140 may be formed by chemical vapor deposition (CVD) techniques using tetra-ethyl-ortho-silicate (TEOS) and oxygen as a precursor. In some other embodiments, materials of the isolation layer 140 may include tetraethylorthosilicate oxide, un-doped silicate glass (USG), or doped silicon oxide such as fused silica glass (FSG), phosphosilicate glass (PSG), boron doped silicon glass, other silicon- and oxygen-containing low density dielectric materials, and other suitable dielectric materials. In yet some other embodiments, the isolation layer 140 is an insulator layer of a SOI wafer.

In some embodiments, the isolation layer 140 is formed by flowable chemical vapor deposition (FCVD). For example, the process may introduce a silicon-containing compound and an oxygen-containing compound as deposition precursors. The silicon-containing compound and the oxygen-containing compound react to form a flowable dielectric material (such as a liquid compound). In some embodiments, an annealing process is then performed to convert the flowable dielectric material to a solid material. For example, the annealing process may be performed at a temperature of about 300 degrees Celsius (° C.) to 1200° C. for a period of time. The annealing process may include rapid thermal annealing (RTA) and/or laser annealing processes.

Figure 7:
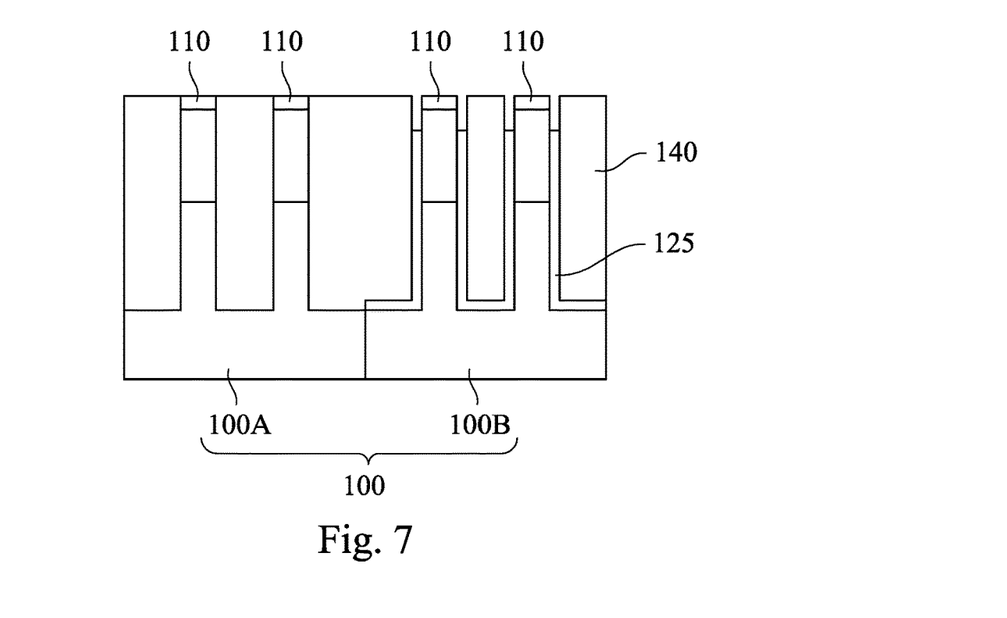

Reference is made to FIG. 7. A planarization process is performed to the isolation layer 140 until the pads 110 are exposed. In some embodiments, the planarization process may be chemical mechanism polishing (CMP) process. In some other embodiments, after the planarization process, another annealing process is performed to further cure the isolation layer 140.

Figure 8:
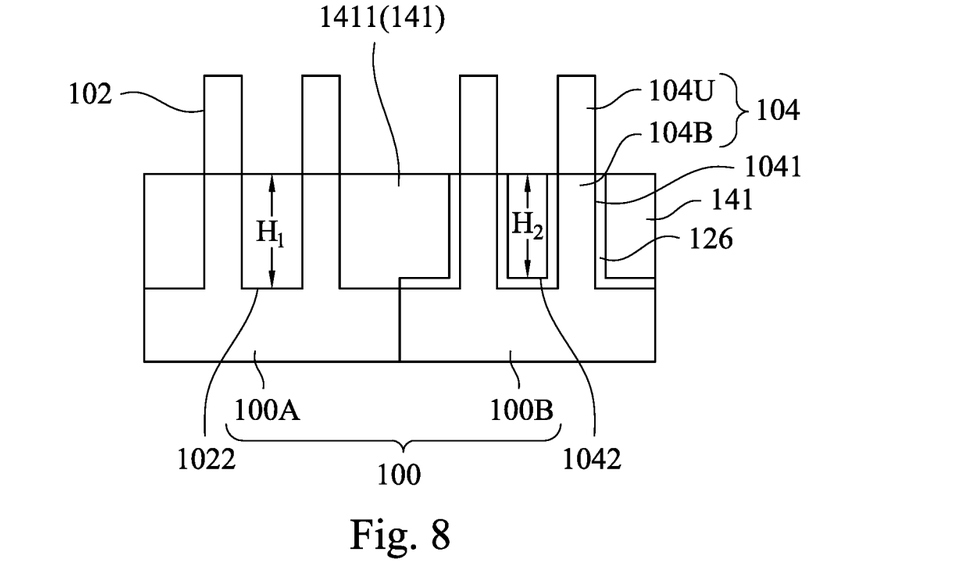

Reference is made to FIG. 8. After the planarization process, one or more etching process(es) are performed to remove the pads 110 and partially remove the isolation layer 140 and the liner 125 (all referring to FIG. 7). After the etching processes, the remained portions of the isolation layer 140 may be referred to isolation structures 141, and the remained liner 125 is labeled as liner 126. The liner 126 is disposed between the second semiconductor fins 104 and the isolation structures 141. That is, the isolation structures 141 are spaced from the second semiconductor fins 104 by the liner 126. Since the liner (e.g. liner 125 of FIG. 3) within the first region 100A of the substrate 100 is removed, as described in FIG. 4, the liner is absent from the first region 100A of the substrate 100.

The liner 126 is disposed on the opposite sidewalls 1041 of the second semiconductor fins 104. In some embodiments, the liner 126 is substantially disposed on the sidewalls of the bottom portion 104B of the second semiconductor fins 104. From other perspectives, the upper portion 104U of the second semiconductor fins 104 substantially protrudes from the liner 126. The isolation structures 141 are disposed over the substrate 100 and cover the liner 126. In some embodiments, the isolation structures 141 are in contact with the first semiconductor fin 102. In some embodiments, a portion 1411 of the isolation structures 141 is in contact with the first semiconductor fin 102 and the liner 126 but spaced from the second semiconductor fins 104.

Since the portion of the liner 125 over the first region 100A of the substrate 100 (referring to FIG. 2) is removed, the isolation structures 141 disposed in the first region 100A has a first thickness $H_1$, and the isolation structures 141 disposed in the second region 100B has a second thickness $H_2$, in which the first thickness $H_1$ is greater than the second thickness $H_2$. From other perspectives, since the liner 126 is disposed between the isolation structures 141 and the second semiconductor fins 104, the bottom surface 1042 of the isolation structures 141 within the second region 100B is higher than the bottom surface 1022 of the isolation structures 141 within the first region 100A.

Figure 9:
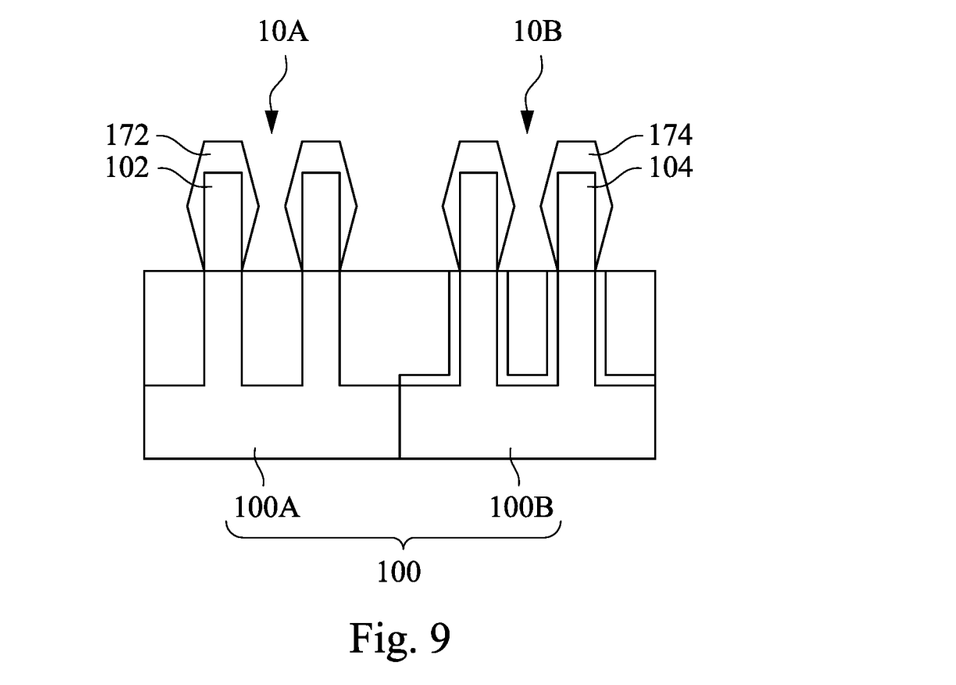

Reference is made to FIG. 9. A plurality of epitaxy structures 172 and 174 are formed respectively over the first semiconductor fins 102 and the second semiconductor fins 104. In some embodiments, at least one of the epitaxy structures 172 and the first semiconductor fins 102 within the first region 100A of the substrate 100 have the same type dopants, such as n-type dopants. For example, at least one of the epitaxy structures 172 and the connected first semiconductor fins 102 may act as a base contact of a p-type metal-oxide-semiconductor (PMOS) device 10A, wherein the transistor configuration of the PMOS device 10A is not shown. That is, the epitaxy structures 172 and the connected first semiconductor fins 102 pick up the base region of the PMOS device. Hence, the first region 100A can be referred to as a base pickup region of the PMOS device. In an n-type region (e.g. the first region 100A), charges (e.g. electrons) may accumulate at an interface between the liner and the semiconductor device, which may also be referred to as "charge effect." However, the accumulated charges may induce lower barrier, and produce a leakage path from the n-type epitaxy structure and the n-type substrate, which is also be referred to as "latch-up effect." In some embodiments of the present disclosure, the liner within the first region 100A of the substrate 100 is removed to reduce the charge effect, and thus the latch up effect may also be reduced, accordingly. Furthermore, at least one of the epitaxy structures 174 and the connected first semiconductor fins 104 may act as a base contact of an n-type MOS (NMOS) device 10B, wherein the transistor configuration of the NMOS device 10B is not shown. That is, the epitaxy structures 174 and the connected second semiconductor fins 104 pick up the body region of the NMOS device. Hence, the second region 100B can be referred to as a body pickup region of the NMOS device. It is noted that although in FIG. 9, the first region 100A and the second region 100B are base regions of MOS devices, in some other embodiments, the first region 100A and the second region 100B may not be base regions. Embodiments fall within the present disclosure if the epitaxy structure, the connected semiconductor fin, and the connected region have the same dopant type (e.g., n-type).

The epitaxy structures 172 and 174 may be formed using one or more epitaxy or epitaxial (epi) processes, such that Si features, SiGe features, and/or other suitable features can be formed in a crystalline state on the semiconductor fins 102 and 104. In some embodiments, lattice constants of the epitaxy structures 172 and 174 are different from lattice constants of the semiconductor fins 102 and 104, such that the semiconductor fins 102 and 104 are strained or stressed to enable carrier mobility of the semiconductor device and enhance the device performance. In some embodiments, the epitaxy structures 172 and 174 may include semiconductor material such as germanium (Ge) or silicon (Si); or compound semiconductor materials, such as gallium arsenide (GaAs), aluminum gallium arsenide (AlGaAs), silicon germanium (SiGe), silicon carbide (SiC), or gallium arsenide phosphide (GaAsP).

The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fins 102 and 104 (e.g., silicon). The epitaxy structures 172 and 174 may be in-situ doped. The doping species include P-type dopants, such as boron or $BF_2$; N-type dopants, such as phosphorus or arsenic; and/or other suitable dopants including combinations thereof. If the epitaxy structures 172 and 174 are not in-situ doped, a second implantation process (i.e., a junction implant process) is performed to dope the epitaxy structures 172 and 174. One or more annealing processes may be performed to activate the epitaxy structures 172 and 174. The annealing processes include rapid thermal annealing (RTA) and/or laser annealing processes.

After the epitaxy structures 172 and 174 are formed, an interlayer dielectric (not shown) may be formed over the substrate 100 to form the semiconductor device. The interlayer dielectric may include silicon oxide, oxynitride or other suitable materials. Another recessing process may be performed to the dielectric layer to form a plurality of openings (not shown) that expose the epitaxy structures 172 and 174. Metal such as tungsten is then deposited into the openings down to the epitaxy structures 172 and 174 to form contacts in the interlayer dielectric.

According to the aforementioned embodiments, a substrate includes a first region having plural first semiconductor fins, and a second region having plural second semiconductor fins, in which the first region and the second region have different type dopants. A liner is formed over the substrate. Then, a portion of the liner within the first region of the substrate is removed. Plural first epitaxy structures are formed respectively over the first semiconductor fins and the second semiconductor fins. At least one of the first epitaxy structures and the first semiconductor fins have the same type dopants. Since the liner is absent from the first region, the charge effect may be reduced to prevent leakage path from the first epitaxy structures to the first semiconductor fins of the substrate. As a result, the performance of the device may be improved.

According to some embodiments, a method includes forming a pad layer and a mask layer over a substrate; patterning the mask layer, the pad layer, and the substrate to form pads, masks, and first and semiconductor fins over the substrate; forming a liner covering the pads, the masks, and the first and second semiconductor fins; removing a first portion of the liner to expose sidewalls of the first semiconductor fin, while leaving a second portion of the liner covering sidewalls of the second semiconductor fin; forming an isolation material over the substrate and covering the pads, the masks, and the first and second semiconductor fins; and performing a CMP process to the isolation material until a first one of the pads over the second semiconductor fin is exposed, in which the CMP process is performed such that a topmost end of the second portion of the liner layer is lower than the first one of the pads over the second semiconductor fin; and etching back the isolation material and the second portion of the liner.

According to some embodiments, a method includes forming a first semiconductor fin over a first region of a substrate and a second semiconductor fin over a second region of the substrate; forming a liner over the substrate and covering the first semiconductor fin and the second semiconductor fin, wherein the liner is in contact with sidewalls of the first semiconductor fin and the second semiconductor fin; removing a first portion of the liner within the first region to expose the sidewalls of the first semiconductor fin, wherein a second portion of the liner remains covering the sidewalls of the second semiconductor fin; and forming an isolation structure over the substrate and adjacent to the first and second semiconductor fins, in which a bottommost surface of the isolation structure is coterminous with a bottommost surface of the second portion of the liner, and wherein the isolation structure is in contact with the first semiconductor fin.

According to some embodiments, a method includes forming first and semiconductor fins over a substrate; forming a liner covering the first and second semiconductor fins; performing a first etching process to remove a first portion of the liner to expose sidewalls of the first semiconductor fin, wherein a second portion of the liner remains covering the second semiconductor fin; performing a second etching process to lower a top surface of the second portion of the liner; and forming first and second epitaxy structures on exposed surfaces of the first and semiconductor fins, respectively, wherein the first epitaxy structure and the first semiconductor fin have a first dopant type, and the second epitaxy structure and the second semiconductor fin have a second dopant type opposite the first dopant type.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
 forming a pad layer and a mask layer over a substrate;
 patterning the mask layer, the pad layer, and the substrate to form pads, masks, and first and second semiconductor fins over the substrate;
 forming a liner covering the pads, the masks, and the first and second semiconductor fins;
 removing a first portion of the liner to expose sidewalls of the first semiconductor fin, while leaving a second portion of the liner covering sidewalls of the second semiconductor fin;
 forming an isolation material over the substrate and covering the pads, the masks, and the first and second semiconductor fins;
 performing a CMP process to the isolation material and the masks until the pads are exposed, wherein a top surface of the isolation material is level with top surfaces of the pads after the CMP process is completed; and
 etching back the pads, the isolation material and the second portion of the liner to expose upper portions of the first and second semiconductor fins.

2. The method of claim 1, further comprising:
 forming a photoresist over the second portion of the liner prior to removing the first portion of the liner; and
 removing the photoresist after removing the first portion of the liner.

3. The method of claim 1, wherein a top surface of the substrate is exposed after removing the first portion of the liner.

4. The method of claim 1, wherein one of the masks over the first semiconductor fin is removed together with the first portion of the liner.

5. The method of claim 4, wherein removing the first portion of the liner is performed such that a second one of the pads over the first semiconductor fin is exposed.

6. The method of claim 5, wherein forming the isolation material over the substrate is performed such that the isolation material is in contact with the second one of the pads over the first semiconductor fin.

7. The method of claim 1, wherein forming the isolation material is performed such that a bottommost surface of the isolation material is coterminous with a bottommost surface of the second portion of the liner.

8. The method of claim 1, wherein forming the liner is performed such that the liner is in contact with sidewalls of the pads and sidewalls of the masks.

9. The method of claim 1, further comprising removing the pads after performing the CMP process.

10. The method of claim 1, wherein after performing the CMP process, the second portion of the liner is exposed.

11. A method, comprising:
 forming a first semiconductor fin over a first region of a substrate and a second semiconductor fin over a second region of the substrate;
 forming a liner over the substrate and covering the first semiconductor fin and the second semiconductor fin, wherein the liner is in contact with sidewalls of the first semiconductor fin and the second semiconductor fin;
 removing a first portion of the liner within the first region to expose the sidewalls of the first semiconductor fin, wherein a second portion of the liner remains covering the sidewalls of the second semiconductor fin;
 forming an isolation structure over the substrate and adjacent to the first and second semiconductor fins, wherein a bottommost surface of the isolation structure is coterminous with a bottommost surface of the second portion of the liner, and wherein the isolation structure is in contact with the first semiconductor fin; and
 forming an epitaxy structure over the second semiconductor fin, wherein the epitaxy structure has a bottom end above a top surface of the liner.

12. The method of claim 11, wherein forming the isolation structure over the substrate comprises:
 depositing an isolation material over the substrate;
 performing a CMP process to the isolation material; and
 etching back the isolation material after performing the CMP process.

13. A method, comprising:
 doping a first region of a substrate with a first dopant and doping a second region of the substrate with a second dopant, wherein the first dopant is different from the second dopant;
 forming first and second semiconductor fins over the first and second regions of the substrate, respectively;
 forming a liner covering the first and second semiconductor fins after doping the first and second regions of the substrate;
 performing a first etching process to remove a first portion of the liner to expose sidewalls of the first semiconductor fin, wherein a second portion of the liner remains covering the second semiconductor fin;
 performing a second etching process to lower a top surface of the second portion of the liner; and
 forming first and second epitaxy structures on exposed surfaces of the first and second semiconductor fins, respectively, wherein the first epitaxy structure and the first semiconductor fin have a first dopant type, and the second epitaxy structure and the second semiconductor fin have a second dopant type opposite the first dopant type.

14. The method of claim 13, wherein a bottom of the second epitaxy structure is above a highest point of the liner.

15. The method of claim 13, further comprising forming an isolation structure between the first and second semiconductor fin, wherein the isolation structure is in contact with the first semiconductor fin and the liner, and a bottommost surface of the isolation structure is aligned with a bottommost surface of the liner.

16. The method of claim 15, wherein forming the isolation structure comprises:
 depositing an isolation material over the substrate after performing the first etching process;
 performing a CMP process to the isolation material; and
 etching back the isolation material after performing the CMP process.

17. The method of claim 16, wherein the CMP process is performed to expose the liner over the second semiconductor fin.

18. The method of claim 11, further comprising:
 forming pads over the first and second semiconductor fins;

forming masks over the pads, wherein the liner is formed lining the pads and the masks; and performing a CMP process to the isolation structure and the masks until the pads are exposed.

19. The method of claim 18, further comprising etching back the pads, the isolation structure and the second portion of the liner to expose upper portions of the first and second semiconductor fins.

20. The method of claim 13, further comprising:

forming pads over the first and second semiconductor fins;

forming masks over the pads, wherein the liner is formed lining the pads and the masks;

forming an isolation structure over the substrate and adjacent the first and second semiconductor fins after performing the first etching process; and performing a CMP process to the isolation structure and the masks until the pads are exposed, wherein the second etching process is performed after performing the CMP process.

* * * * *